United States Patent
Subido et al.

(10) Patent No.: US 7,476,597 B2
(45) Date of Patent: Jan. 13, 2009

(54) METHODS AND SYSTEMS FOR LASER ASSISTED WIREBONDING

(75) Inventors: Willmar E. Subido, Garland, TX (US); Edgardo Hortaleza, Garland, TX (US); Stuart M. Jacobsen, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 80 days.

(21) Appl. No.: 11/456,404

(22) Filed: Jul. 10, 2006

(65) Prior Publication Data

US 2008/0009129 A1     Jan. 10, 2008

(51) Int. Cl.
*H01L 21/322* (2006.01)
*H01L 21/44* (2006.01)
*H01L 21/00* (2006.01)

(52) U.S. Cl. ............... 438/473; 438/612; 438/799

(58) Field of Classification Search .............. 438/617, 438/612, 597, 584, 615, 473, 799; 257/E23.02, 257/E21.517
See application file for complete search history.

(56) References Cited

U.S. PATENT DOCUMENTS

| | | | |
|---|---|---|---|
| 5,817,544 A * | 10/1998 | Parthasarathi | 438/123 |
| 5,938,952 A * | 8/1999 | Lin et al. | 219/121.64 |
| 6,717,100 B2 | 4/2004 | Ruben | |
| 6,835,898 B2 * | 12/2004 | Eldridge et al. | 174/267 |
| 6,858,910 B2 * | 2/2005 | Coyle et al. | 257/415 |
| 2001/0008792 A1 * | 7/2001 | Evers | 438/617 |
| 2004/0014266 A1 * | 1/2004 | Uno et al. | 438/200 |
| 2005/0001314 A1 * | 1/2005 | Tanaka et al. | 257/738 |
| 2005/0082266 A1 * | 4/2005 | Song et al. | 219/121.72 |
| 2005/0145605 A1 * | 7/2005 | Faour et al. | 219/121.7 |
| 2005/0150932 A1 * | 7/2005 | Hosseini | 228/180.5 |
| 2005/0184133 A1 * | 8/2005 | Clauberg et al. | 228/203 |

OTHER PUBLICATIONS

Arjavalingam, G, et al., "Laser Ablative Cleaning of Bonding Surfaces," Sep. 1, 1989, IBM TDB Technical Disclosure, pp. 429-430.*

* cited by examiner

*Primary Examiner*—Hsien-ming Lee
*Assistant Examiner*—Kevin A Parendo
(74) *Attorney, Agent, or Firm*—Yingsheng Tung; Wade J. Brad, III; Frederick J. Telecky, Jr.

(57) ABSTRACT

The invention provides methods and systems for laser assisted wirebonding. One or more conditioning laser pulses are used to prepare a bonding surface for wirebonding by removing impurities such as residues from manufacturing processes, oxides, or irregularities on the bonding surface. Subsequently, a free air ball is brought into contact with the conditioned bonding surface to form a weld.

18 Claims, 2 Drawing Sheets

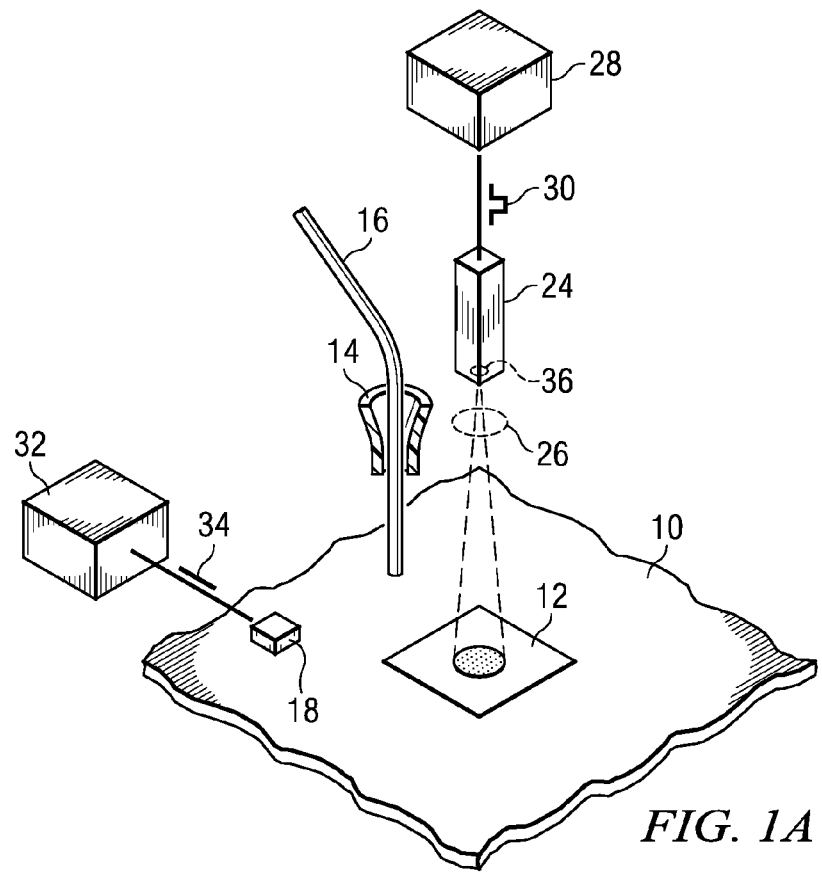
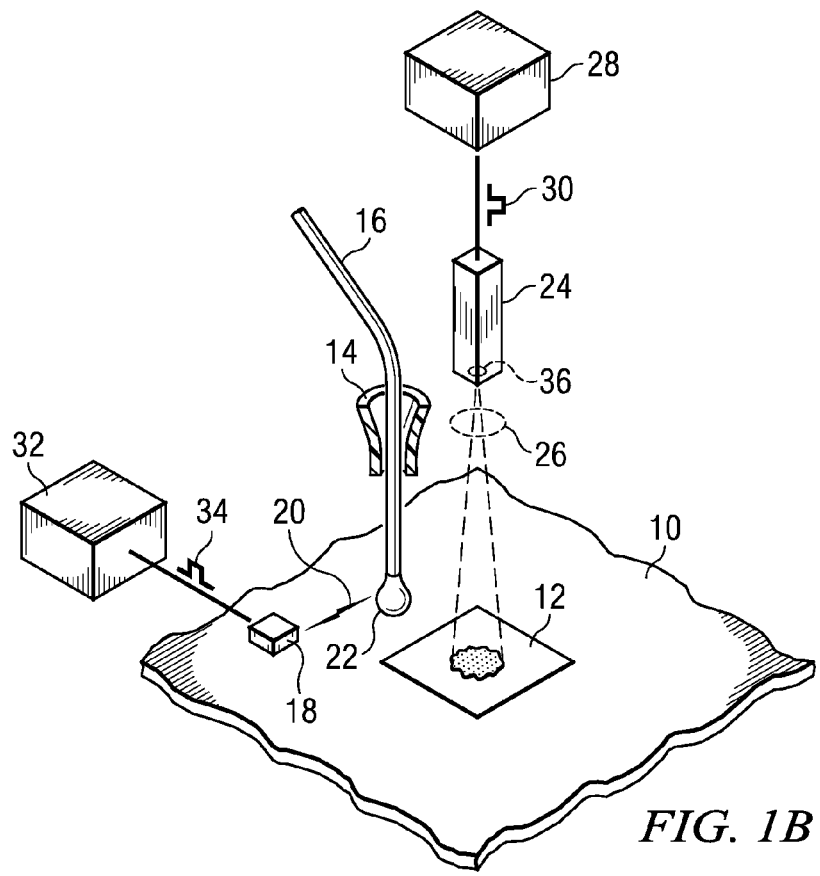

METHODS AND SYSTEMS FOR LASER ASSISTED WIREBONDING

TECHNICAL FIELD

The invention relates to electronic semiconductor devices and manufacturing. More particularly, the invention relates to methods for making welded interconnections between microelectronic components, especially wirebonding.

BACKGROUND OF THE INVENTION

Welding is a process of joining metals by melting workpieces to form a molten "weld puddle" that coalesces upon cooling to form a metal joint. Often pressure and/or ultrasonic energy are also applied to the components as well as heat in order to produce a weld. In the context of microelectronics, the specialized welding process most often used is termed "wirebonding". Wirebonding generally refers to the process of forming an electrical connection between the silicon chip and the external leads of the semiconductor device using very fine wires welded to terminals at each end, such as a bond pad on a chip and a lead finger on a leadframe. The wires used in wirebonding are usually made of gold. There are two common wirebond processes distinguished by the shape of the weld, "ball" bonding, and "stitch" or "wedge" bonding. During wirebonding, a molten "free air ball" is formed by melting the free end of the wire, held by a "bonding head" or "capillary", using a high voltage spark in a technique known as electronic flame-off (EFO). The free air ball typically has a diameter ranging from 1.5 to 2.5 times the wire diameter. The free air ball is then brought into contact with the bond pad, which is usually heated by other means. The general practice in the arts is to apply pressure to the press the free air ball into the surface of the bond pad. To further assist in ensuring adequate contact between the bondwire and bond pad, it is common to also apply ultrasonic forces to the bond wire, in effect rubbing it in contact with the bond pad during heating to form a metallurgical weld between the ball and the bond pad and deforming the weld itself into its final shape. Continuing the process, the wire is run from the chip to a corresponding terminal such as the finger of a leadframe, forming a gradual arc or "loop" between the bond pad and the leadfinger. Again, EFO, pressure, and ultrasonic forces are applied to the wire to form a stitch bond with the leadfinger. The wirebonding machinery severs the wire in preparation for the next wirebond cycle, usually by clamping the wire and raising the bonding head. The cycle repeats with repositioning the wire for a new bond. It is known to make numerous such wirebond connections between bond pads on a chip and the ends of leadfingers, often at the rate of several per second.

Although wirebonding is well known, problems persist in forming satisfactory wirebonds due to a variety of factors. One of the problems is the potential to cause damage to the bond pads due to the application of pressure and/or ultrasonic energy. Particularly in the case of delicate bond pads having multiple layers including metallic and low-K or ultra-low-K layers, the ultrasonic energy can cause cracks in one or more layers, which may inhibit or prevent the formation of a weld, or may weaken the bond pad making it prone to further breakage later. Contaminants or irregularities on the bonding surface can also inhibit weld formation. In addition to potential problems with weld formation, another related problem is "ball lifting" after weld formation due to defective welds. The formation of strong welds may be inhibited by the presence of contaminants on the bond pad, which act as barriers between the ball and the bond pad. Common contaminants that inhibit wirebonding may include residual glass, photoresist, silicon dust, die attach adhesive, or other impurities generated during the manufacturing process. Corrosion, or the formation of metal oxides on the exposed surface of the bond pads or lead fingers may also prevent the formation of an adequate weld. Yet another potential for problems may arise from disturbed or uneven bond pad surfaces. Such irregularities in the bonding surface may cause unexpected variations in the weld formation process. Excessive interdiffusion between the bond pad and wirebond metals or the formation of voids underneath the bond may also arise to create weak, and ultimately lifted welds. There is a need in the arts for improved wirebonding methods and systems for ensuring uniformity in the welding process and the formation of robust welds while reducing or eliminating one or more of these and possibly other problems.

SUMMARY OF THE INVENTION

In carrying out the principles of the present invention in accordance with preferred embodiments thereof, a laser is employed in combination with familiar wirebonding processes and tools. The laser is used for preparatory conditioning of bonding surfaces.

According to one aspect of the invention, a method for wirebonding in a manufacturing process for a microelectronic semiconductor device having a bonding surface and a bondwire includes steps for conditioning the bonding surface by the application of at least one laser pulse. A free air ball is formed on the bondwire for welding and is placed in contact with the laser conditioned bonding surface to form a weld joining the wire with the bonding surface.

According to another aspect of the invention, an embodiment of a method for wirebonding includes using one or more conditioning laser pulses having a wavelength of about 1064 nanometers.

According to yet another aspect of the invention, a system for bonding a wire to a bonding surface for use in a manufacturing process for microelectronic semiconductor devices includes a bonding tool for manipulating the bondwire and an EFO electrode for forming a free air ball on the bondwire. A neodymium-doped yttrium aluminum garnet, (Nd:$Y_3Al_5O_{12}$) laser, also called a Nd:YAG laser, is used for conditioning the bonding surface with the application of at least one laser pulse. The components of the system are operably coupled to act in concert, having one or more controllers for controlling the laser pulses, free air ball formation, and bondwire manipulation, whereby the molten free air ball is placed in contact with the conditioned bonding surface to form a weld.

According to still another aspect of the invention, the laser of the wirebonding system is a Q-switched laser.

According to another aspect of the invention, the system further includes optics configured for adapting the laser pulses to the geometry of the bonding surface.

According to other aspects of preferred embodiments of the invention, the methods and systems of the invention may be adapted within the scope of the invention and without undue experimentation for use with bondwires, bond pads, and leads of various materials including gold, copper, aluminum, silver, and palladium.

The invention has advantages including but not limited to providing systems and methods for ball and stitch bonding using a laser for surface preparation and welding to ensure improved weld formation. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which:

FIG. 1A is a simplified block diagram showing a top front perspective view of an example of the systems and method steps of the invention;

FIG. 1B is a simplified block diagram showing a top front perspective view of an example of the systems and further method steps of the invention;

References in the detailed description correspond to like references in the various drawings unless otherwise noted. Descriptive and directional terms used in the written description such as top, bottom, upper, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DESCRIPTION OF PREFERRED EMBODIMENTS

In general, the invention provides methods and systems for laser assisted wirebonding. One or more conditioning laser pulses are used to prepare the bonding surface for wirebonding by removing impurities such as residues left from earlier manufacturing processes, oxides formed on exposed bonding surfaces, or irregularities on the surface. Subsequent to laser conditioning the bonding surface, a free air ball is brought into contact with the bonding surface to form a weld.

Figure 1C:
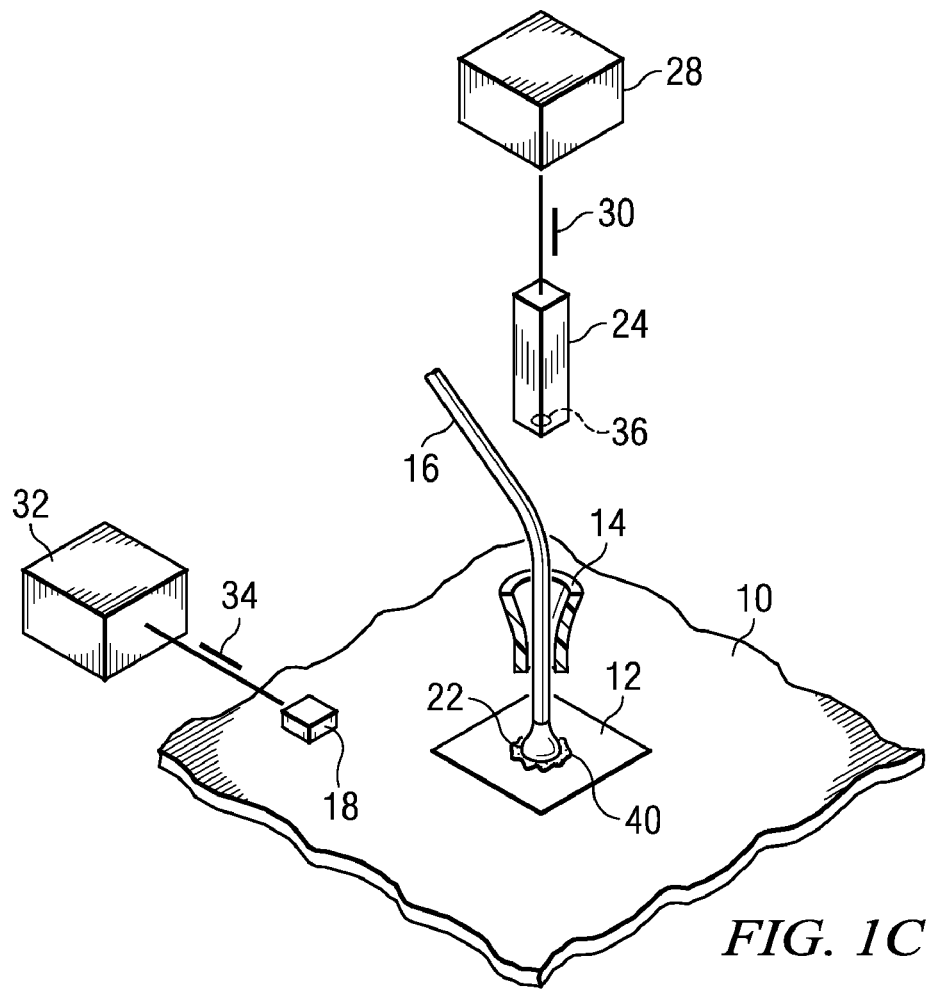
FIG. 1C is a simplified block diagram showing a top front perspective view of an example of the systems and additional method steps of the invention.

Referring to FIGS. 1A through 1C, an overview an example of a system for implementing methods and steps in laser assisted wirebonding according to the invention is introduced. A workpiece 10 includes a bonding surface 12, in this example a bond pad. A lead finger bonding surface may be equally common in the arts and it should be understood that the invention is not limited to a particular type of bonding surface. The bonding surface 12 may be a relatively thick layer of metal or a relatively complex multilayer structure having a metallic outer surface for welding. The systems and methods of the invention may advantageously employ common wirebonding tools in which bondwire is supplied through a "bonding head". The exact nature of the bonding head is generally determined by the nature of the bond to be made, for example, for a ball bond, a "capillary" type bonding head is typical. For making a wedge or stitch bond, a "wedge" type bonding head is generally used. These terms have generally recognized but not necessarily universal meaning in the art. For the purposes of describing the invention, the term "bonding tool" 14 is used to indicate a bonding head suitable for manipulating bondwire 16 for making either ball or wedge bonds. An EFO electrode 18 is typically positioned in close proximity to the bonding wire 16 such that a powerful spark 20 (FIG. 1B) may be generated at precisely controlled intervals in order to form a free air ball 22 at the end of the bondwire 16. A laser 24 capable of generating high-energy pulses 26 is positioned in close proximity to the bonding surface 12. A laser controller 28 is configured for generating a control signal 30 in close coordination with the spark controller 32 and its control signal 34, and also in close coordination with the bondwire manipulations of the bonding tool 14. The laser 24 is provided with optics 36 for adjusting the area of the laser pulses 26 in accordance with the geometry of the bonding surface 12.

The laser 24 is preferably a Nd:YAG pulsed laser with a fluence in a range of about 1 microjoule to 1 Joule per square centimeter, and a pulse width of approximately 1 to 100 nanoseconds and a repetition rate within a range of about 10 Hz to 10 kHz. Nd:YAG lasers are known in the arts for use in manufacturing, particularly for cutting and welding. Nd:YAG lasers typically emit light with a wavelength of 1064 nm, in the infrared. The Nd:YAG lasers known in the arts may operate in both pulsed and continuous mode. Pulsed Nd:YAG lasers are typically operated in a "Q-switching" mode, in which an optical switch is inserted in the laser cavity awaiting an optimum population inversion in the neodymium ions before it opens to emit a pulse. The pulses used for the invention are obtainable by Q-switching. The result is a short pulse of light output from the laser, or a series of such pulses, which have a peak intensity sufficient for ablating material from the bonding surface. The laser 24 is positioned for directing a laser beam to the bonding surface(s) of the workpiece(s).

The optics 36 are used to create a Gaussian laser beam with a radius adapted to the size and shape of the particular bonding surface. For a typical bond pad and bondwire, for example, a beam with a radius of about 10-15 um may be required. In most laser applications, it is necessary to focus, modify, or shape the laser beam by using optical elements such as lenses. In general, laser-beam propagation can be approximated by assuming that the laser beam has an ideal Gaussian intensity profile. The properties of Gaussian beams and the means for adjusting to practical departures from the theoretical Gaussian are known in the arts. Those skilled in the arts may use known propagation and optical techniques to adapt the laser pulses for implementing the invention in particular applications and for various bonding surface geometries.

Now referring primarily to FIG. 1A, on a bonding surface 12, contaminants are often present due to previous manufacturing processes or due to the environment. On a metallic bond pad surface, for example, metal oxide is often present due to exposure of the bond pad surface to the surrounding air. One or more conditioning pulses 26 are preferably used to ablate the contaminants, such as metal oxides, from the bonding surface 12. The duration and number of pulses 26 may be selected based on process parameters such as bonding surface materials and contaminants found present. A controller is preferably used to precisely control the timing of the laser pulses in coordination with the bond spark. The controller may be used to adapt a versatile range of laser pulse and spark sequences to suit particular bonding tasks. For copper bond pads, for example, pulse fluences and timing sequences may be tailored to the removal of copper oxide CuO from the bond pad surface prior to welding. In another example, for aluminum leadframes, pulse fluences and timing sequences may be tailored to the removal of aluminum oxide $Al_2O_3$ from the lead finger surface prior to welding. It should be appreciated that the conditioning pulses 26 may also be used for reducing irregularities on the bonding surface 12 as well as for removing impurities. The laser pulses may be singular, as in for example the use of a single pulse to ablate about 20 Angstroms of surface material, or multiple, as in the use of four pulses ablating about 25 Angstroms each. The duration, intensity and frequency of the laser pulses may be adapted to many specific applications within the scope of the invention.

As illustrated in FIG. 1B, one or more additional laser pulses 26 may be applied to the bonding surface 12 in order to further condition the bonding surface 12 in the path of the free air ball 22 formed on the bond wire 16 by the EFO spark 20. Multiple pulses may be used as needed to ablate contaminants, or to make an uneven surface more regular. The control signals 30, 34 are coordinated in such a way that the temperatures of the bonding surface 12 and free air ball 22 at the time and place of contact are suitable for weld formation. Welding temperatures may be obtainable without applying additional heat to the bonding surface 12 from below, or additional heating may be applied to the bonding surface 12 as is known in the arts. As shown in FIG. 1C, the free air ball 22 is brought into contact with the conditioned bonding surface 12 and cooled to form a weld 40. Preferably, weld 40 formation is caused to occur by bringing the free air ball 22 into contact with the bonding surface 12 with little or no application of ultrasonic energy to the bondwire 16 and bonding surface 12. Although some application of pressure is required for weld formation, pressure may be applied sparingly in order to reduce the potential for damage to the bonding surface. In some applications, depending primarily upon the materials being welded, the use of ultrasound may be avoided altogether. Using the invention, welds may be made with reduced risk of damage to bonding surfaces, particularly in applications where it is desirable to minimize the application of ultrasonic energy or pressure as in the case of multilayer bond pads having thin low-K or ultra-low-k layers. It should also be appreciated that the systems and methods of the invention may be used for wirebonding using various materials less suited for common methods while nevertheless obtaining useable welds with adequate intermetallic compound formation. For example, the invention may be used with bondwires and bonding surfaces made from materials including gold, copper, silver, aluminum, palladium, or other combinations of these and other metals. In one further example of an embodiment of the invention, copper bondwires may be welded to copper bonding surfaces.

Figure 2:
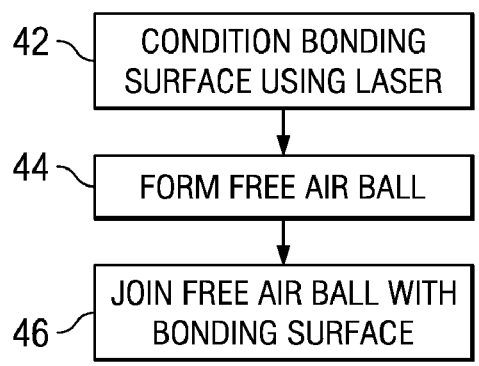
FIG. 2 is a simplified process flow diagram showing an alternative view of steps in an example of methods of the invention.

FIG. 2 presents an alternative depiction of the methods of the invention. The bonding surface is conditioned using one or more laser pulses as shown in box 42. A free air ball is formed, step 44. The free air ball is joined with the bonding surface to form a weld, 46. It should be understood by those familiar with the arts that the steps of the invention may advantageously be performed in combination with adaptations to various wirebonding systems and processes used in the arts. In the formation of a stitch bond or a ball bond using the invention, the formation of the free air ball is coordinated with the surface-conditioning laser pulse(s) prior to bringing the materials together for weld formation.

The methods and systems of the invention provide one or more advantages which may include improving wirebonds, reducing or eliminating contaminants or surface irregularities in wirebonding processes, and reducing or eliminating the use of ultrasound for wirebond formation. In some applications, the invention may be used with established manufacturing processes with practical and cost-effective modification. While the invention has been described with reference to certain illustrative embodiments, those described herein are not intended to be construed in a limiting sense. For example, variations or combinations of steps in the embodiments shown and described may be used in particular cases without departure from the invention. Modifications and combinations of the illustrative embodiments as well as other advantages and embodiments of the invention will be apparent to persons skilled in the arts upon reference to the drawings, description, and claims.

We claim:

1. In a manufacturing process for a microelectronic semiconductor device having a bonding surface and a bondwire, a method of wirebonding comprising:
    conditioning the bonding surface with an application of at least one first laser pulse to form a conditioned bonding surface;
    forming a free air ball on the bondwire for welding;
    applying at least one second laser pulse to the bonding surface to heat the bonding surface to a welding temperature; and
    placing the free air ball in contact with the conditioned bonding surface to form a weld joining the bondwire with the bonding surface at the welding temperature, wherein the weld is formed without applying ultrasonic energy to the bonding surface.

2. A method according to claim 1 wherein the at least one first and second laser pulses consist of light having a wavelength of about 1064 nanometers.

3. A method according to claim 1 wherein the at least one first and second laser pulses have a fluence within a range of about one micro-Joule to about one Joule per square centimeter.

4. A method according to claim 1 wherein the at least one first and second laser pulses have a duration of about one to one hundred nanoseconds.

5. A method according to claim 1 wherein the at least one first and second laser pulses comprise a plurality of laser pulses having a repetition rate of about 10-10,000 Hertz.

6. A method according to claim 1 wherein the bondwire comprises gold.

7. A method according to claim 1 wherein the bondwire comprises copper.

8. A method according to claim 1 wherein the bondwire comprises aluminum.

9. A method according to claim 1 wherein the bondwire comprises silver.

10. A method according to claim 1 wherein the bondwire comprises palladium.

11. A method according to claim 1 wherein the bonding surface comprises aluminum.

12. A method according to claim 1 wherein the bonding surface comprises copper.

13. A method according to claim 1 wherein the weld is formed without applying additional heat from below the bonding surface.

14. A method according to claim 1 wherein the bonding surface is a multilayer bond pad comprising a layer chosen from a low-K layer or an ultra-low-K layer.

15. In a manufacturing process for microelectronic semiconductor devices, a system for bonding, comprising:
    a bonding tool for manipulating a bondwire;
    an EFO electrode for applying a bond spark for forming a free air ball on the bondwire;
    a laser for conditioning a bonding surface with an application of at least one laser pulse to form a conditioned bonding surface; and
    a controller operably connected for controlling the at least one laser pulse, free air ball formation, and bondwire manipulation, the controller being capable of precisely controlling timing of the at least one laser pulse in coordination with the bond spark in such a way that temperatures of the bonding surface and free air ball are suitable for weld formation when the free air bait of the bondwire is placed in contact with the conditioned bonding surface to form a weld without applying additional heat from below the bonding surface.

16. A system according to claim 15 wherein the laser further comprises a Nd:YAG laser.

17. A system according to claim 15 wherein the laser further comprises a Q-switched laser.

18. A system according to claim 15 further comprising optics operably coupled to the laser and configured for adapting the laser to a geometry of the bonding surface.

* * * * *